US010958063B2

(12) United States Patent
Jimenez et al.

(10) Patent No.: US 10,958,063 B2
(45) Date of Patent: Mar. 23, 2021

(54) GROUND FAULT MODULES AND RELATED CIRCUIT INTERRUPTERS AND METHODS

(71) Applicant: Eaton Intelligent Power Limited, Dublin (IE)

(72) Inventors: Sandy Omar Jimenez, Monaca, PA (US); James Gerard Maloney, Industry, PA (US); Rajesh Kumar Reddy Appal, Oakdale, PA (US)

(73) Assignee: Eaton Intelligent Power Limited, Dublin (IE)

( * ) Notice: Subject to any disclaimer, the term of this patent is extended or adjusted under 35 U.S.C. 154(b) by 526 days.

(21) Appl. No.: 15/883,676

(22) Filed: Jan. 30, 2018

(65) Prior Publication Data

US 2019/0109452 A1 Apr. 11, 2019

Related U.S. Application Data

(60) Provisional application No. 62/576,935, filed on Oct. 25, 2017, provisional application No. 62/569,843, filed on Oct. 9, 2017.

(51) Int. Cl.
*H02H 3/00* (2006.01)
*H02H 3/16* (2006.01)
*H05K 5/02* (2006.01)
*H05K 7/02* (2006.01)
*H05K 1/16* (2006.01)
*H05K 13/00* (2006.01)
*H01R 13/62* (2006.01)
*H02H 3/33* (2006.01)
(Continued)

(52) U.S. Cl.
CPC .............. *H02H 3/16* (2013.01); *H01H 71/00* (2013.01); *H01R 13/6205* (2013.01); *H02H 3/33* (2013.01); *H05K 1/165* (2013.01); *H05K 5/0217* (2013.01); *H05K 7/023* (2013.01); *H05K 13/0015* (2013.01); *H02H 1/00* (2013.01)

(58) Field of Classification Search
None
See application file for complete search history.

(56) References Cited

U.S. PATENT DOCUMENTS 3,812,400 A * 5/1974 Gryctko ............. H01H 71/0271
361/45
3,922,586 A * 11/1975 Buxton .................. H02B 1/056
361/643
4,503,408 A 3/1985 Mrenna et al.
(Continued)

*Primary Examiner* — Stephen W Jackson
(74) *Attorney, Agent, or Firm* — Myers Bigel, P.A.

(57) ABSTRACT

Plug-on ground fault modules are configured with a housing and at least one ground fault terminal. The at least one ground fault terminal can be a rigid or semi-rigid member that is configured to slidably engage a circuit breaker terminal. The modules also include aground fault circuit coupled to the ground fault terminal and at least one printed circuit board in the housing with components of the ground fault circuit including at least one solenoid assembly coupled thereto with a respective magnetized or magnetic plunger member residing on or adjacent thereto, and at least one current transformer. The modules also include at least one collar assembly residing in the housing spaced apart from the solenoid assembly and plunger member that is arranged to be able to engage a lever in the circuit interrupter to delatch the circuit interrupter.

22 Claims, 16 Drawing Sheets

(51) Int. Cl.
*H01H 71/00* (2006.01)
*H02H 1/00* (2006.01)

(56) References Cited

U.S. PATENT DOCUMENTS

| | | |
|---|---|---|
| 4,641,217 A | 2/1987 | Morris et al. |
| 4,736,174 A | 4/1988 | Castonguay et al. |
| 4,786,885 A | 11/1988 | Morris et al. |
| 5,117,211 A | 5/1992 | Morgan et al. |
| 8,222,983 B2 | 7/2012 | Zhou et al. |

* cited by examiner

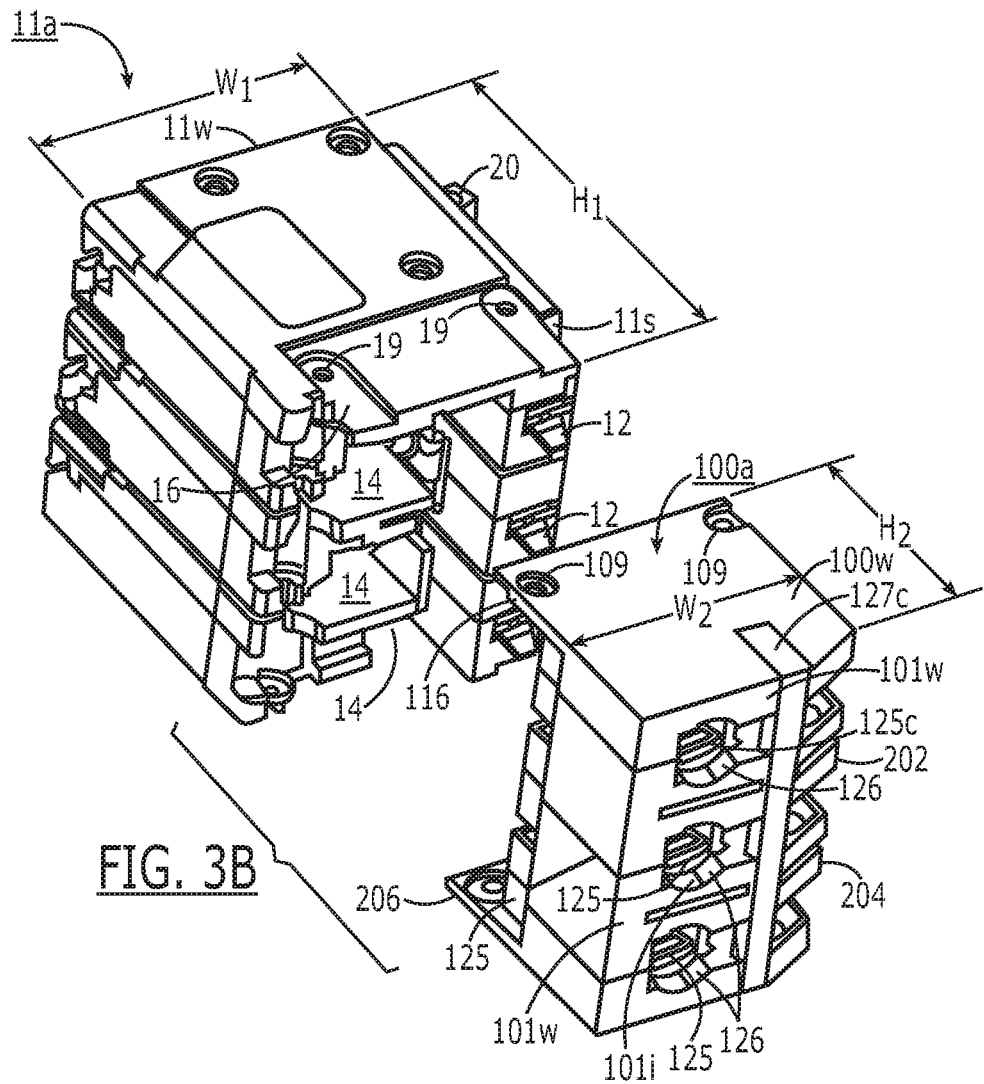

GROUND FAULT MODULES AND RELATED CIRCUIT INTERRUPTERS AND METHODS

RELATED APPLICATIONS

This application claims priority to and the benefit of U.S. Provisional Patent Application Ser. No. 62/569,843, filed Oct. 9, 2017 and U.S. Provisional Patent Application Ser. No. 62/576,935 filed Oct. 25, 2017, the contents of which are hereby incorporated by reference as if recited in full herein.

FIELD OF THE INVENTION

The present invention relates to circuit interrupters.

BACKGROUND OF THE INVENTION

Circuit interrupters such as circuit breakers are one of a variety of overcurrent protection devices used for circuit protection and isolation. The circuit breaker provides electrical protection whenever an electric abnormality occurs. In a typical circuit breaker, current enters the system from a power line and passes through a line conductor to a stationary contact fixed on the line conductor, then to a movable contact. The movable contact is fixedly attached to a pivoting arm. Arc chutes can be used to direct an arc away from the electrical contacts into the arc chute. The arc chute is situated proximate to the stationary contact of the circuit. As long as the stationary and movable contacts are in physical contact, current passes between the stationary contact and the movable contact and out of the circuit breaker to down-line electrical devices.

In the event of an overcurrent condition (e.g., a short circuit), extremely high electromagnetic forces can be generated. The electromagnetic forces can be used to separate the movable contact from the stationary contact. Upon separation of the contacts and blowing open the circuit, an arcing condition occurs. The breaker's trip unit will trip the breaker which will cause the contacts to separate. Also, arcing can occur during normal "ON/OFF" operations of the breaker.

Conventional ground fault circuits reside inside a housing of the circuit breaker placing sensitive electronics relatively close to arcing components which can limit amperage and interrupting levels. Also, conventional thermal magnetic circuit breakers with ground fault circuits have complicated wiring arrangements making assembly challenging.

SUMMARY OF EMBODIMENTS OF THE INVENTION

Embodiments of the invention are directed to plug-on ground fault modules for circuit interrupters such as circuit breakers.

A circuit interrupter that includes a first housing; a first terminal in the first housing; a second housing coupled to the first housing; a ground fault circuit in the second housing; and a second terminal electrically coupled to the ground fault circuit and electrically coupled to the first terminal.

The second terminal can include a projecting rigid or semi-rigid free end portion that faces the first terminal. The first terminal can include an aligned projecting rigid or semi-rigid free end portion. The first terminal free end portion and the second terminal free end portion can abut to electrically couple the second terminal to the first terminal.

The circuit interrupter can also include: a handle held by the first housing; a movable arm in communication with the handle and holding an electrical contact at an end portion thereof; a line terminal assembly with a stationary contact adjacent the end portion of the movable arm with the electrical contact; a pivotable lever spaced apart from the movable contact arm, facing the second housing; a solenoid assembly comprising a respective magnetic or magnetized member in the second housing that is sized and configured to be able to magnetically attract the pivotable lever toward the solenoid assembly; and at least one printed circuit board in the second housing comprising components of the ground fault circuit.

The first terminal can have an outer end portion that extends outside a boundary of the first housing into the second housing.

The circuit interrupter can be a two pole or three pole device. The first housing can be a first housing assembly with a plurality of stacked adjacent first housing members with a respective first terminal for each pole comprising a free outer end portion extending external from the first housing. The second housing can be a second housing assembly with a plurality of stacked adjacent housing members. The first housing assembly can include first and second outer walls and the second housing assembly can include first and second outer walls that attach to the first and second outer walls of the first housing assembly.

The circuit interrupter can be a two pole or three pole device and can have a rating of 10 A-200 A.

The ground fault circuit in the second housing can include at least one printed circuit board. The second housing can be a second housing assembly with cooperating first and second outer walls and at least one of the first and second outer walls can include an internal barrier wall that faces the first housing and projects a distance above the at least one printed circuit board in the second housing to thereby provide a barrier from arc debris.

The second housing can be a second housing assembly with a plurality of stacked adjacent housing members, at least one housing member for each pole and with the at least one housing member for each pole comprising an internal wall segment with an arcuate recess. The circuit interrupter can further include: at least one printed circuit board in the second housing and comprising components of the ground fault circuit; and at least one collar assembly for each pole positioned adjacent an open channel bounded in part by the arcuate recess that is sized and configured to route a cable to couple a load input to the ground fault circuit.

The first housing can have a height and a width that is larger than a height and a width of the second housing.

The solenoid assembly can be provided as a plurality of solenoid assemblies in the second housing. The at least one printed circuit board can include one printed circuit board that holds the plurality of solenoid assemblies adjacent each other.

Other embodiments are directed to ground fault modules that include: a housing; and at least one ground fault terminal. The at least one ground fault terminal is a rigid or semi-rigid member that is configured to slidably engage a circuit breaker terminal. The modules also include a ground fault circuit coupled to the ground fault terminal; at least one printed circuit board in the housing with components of the ground fault circuit including at least one solenoid assembly coupled thereto with a plunger member residing on or adjacent thereto, and at least one current transformer; and at least one collar assembly residing in the housing spaced apart from the solenoid assembly and plunger member.

The housing can include apertures on first and second spaced apart corner portions thereof sized and configured for receiving fixation members to attach the housing to a housing comprising a circuit interrupter.

The housing can include at least one outer wall that comprises an internal barrier wall that projects a distance above the at least one printed circuit board. The internal barrier wall can include a solid front wall with a first wall segment that can have an arcuate recess that allows the plunger to extend and retract and can also include a second wall segment forming a rectangular pocket that can sized and configured to hold the at least one current transformer to thereby provide a barrier from arc debris.

The ground fault module can be a two pole or three pole ground fault module. There can be one collar assembly of the at least one collar assembly for each pole and one solenoid assembly of the at least one solenoid assembly for each pole.

The at least one printed circuit board includes one printed circuit board that holds a plurality of solenoid assemblies adjacent each other.

The ground fault terminal can be a stab that resides inside the housing that faces an open space sized and configured to slidably engage a terminal spring of a circuit interrupter.

The housing can be a housing assembly comprising a plurality of stacked adjacent housing members, at least one housing member for each pole and with the at least one housing member for each pole comprising an internal wall segment with an arcuate recess.

Still other embodiments are directed to methods of assembling a current interrupter that include: (a) providing a first housing assembly comprising a molded case circuit interrupter with at least one outwardly projecting terminal comprising an external free end portion; (b) providing a second housing assembly comprising a ground fault module and at least one ground fault module terminal; (c) slidably coupling one of the at least one outwardly projecting terminal with a corresponding one of the at least one ground fault module terminal; and (d) attaching the first housing to the second housing.

The second housing can have at least one printed circuit board in communication with a solenoid assembly and a magnetic or magnetized member and at least one collar assembly. The first housing can have a pivotable lever. In operation, the pivotable lever can pivot in response to a magnetic force applied by the magnetic or magnetized member to delatch the circuit breaker.

The second housing can be smaller than the first housing and the first housing can have an externally accessible pivoting handle coupled to a movable arm with a contact on an end portion thereof.

Optionally, the second housing comprises an outer wall with a curvilinear internal barrier wall.

The at least one projecting terminal of the circuit interrupter and the at least one ground fault module terminal can have a plug-in configuration whereby the slidably coupling is carried out so that end portions of aligned terminals abut and electrically directly couple without loose lengths of wiring, optionally wherein the circuit interrupter is a thermal magnetic two pole or three pole circuit breaker having a rating in a range of 10 A-200 A.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 3B is another side perspective view of the components shown in FIG. 3A.

DETAILED DESCRIPTION OF EMBODIMENTS OF THE INVENTION

Figure 1A:
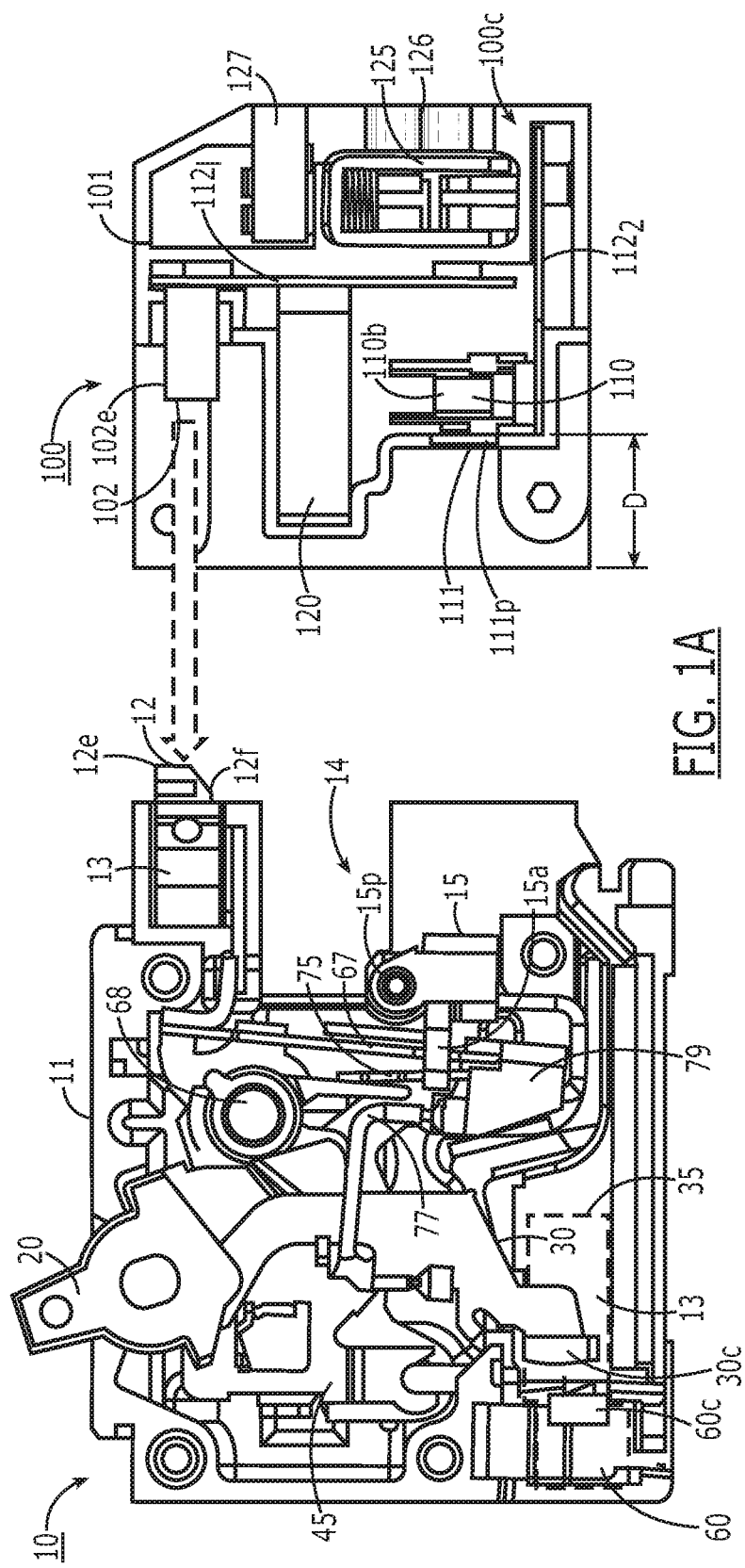
FIG. 1A is a partial view of a circuit breaker aligned with a cooperating ground fault module according to embodiments of the present invention.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art. The term "Fig." (whether in all capital letters or not) is used interchangeably with the word "Figure" as an abbreviation thereof in the specification and drawings. In the figures, certain layers, components or features may be exaggerated for clarity, and broken lines illustrate optional features or operations unless specified otherwise. In addition, the sequence of operations (or steps) is not limited to the order presented in the claims unless specifically indicated otherwise.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass orientations of above, below and behind. The device may be otherwise oriented (rotated 90° or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Turning now to the figures, FIG. 1A illustrates a circuit interrupter 10, shown as a thermal magnetic circuit breaker, with a first housing 11 aligned with a second housing 101 comprising a cooperating ground fault module 100. While the circuit interrupter 10 is shown as a circuit breaker, other circuit interrupters may be used as will be known to those of skill in the art. However, the circuit interrupter 10 will be referred to as a circuit breaker in the below description for ease of discussion.

The second housing 101 contains the ground fault module 100 with a ground fault circuit 100c including a ground fault module terminal 102 and at least one printed circuit board 112, shown as first and second printed circuit boards $112_1$, $112_2$, comprising circuit components of the ground fault circuit 100c. The electrical terminal 102 can engage a corresponding circuit interrupter (i.e., breaker) terminal 12.

Figure 1B:
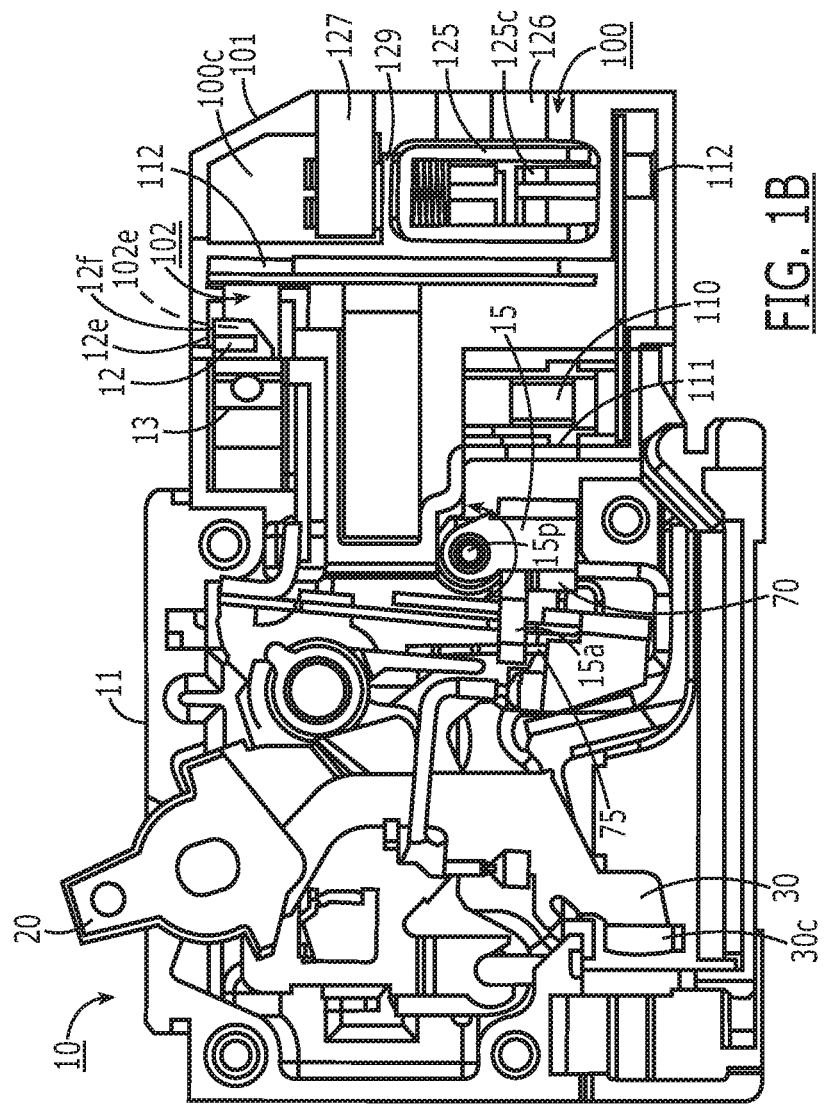
FIG. 1B is an assembled view of the components shown in FIG. 1A according to embodiments of the present invention.

Although the at least one printed circuit board 112 is shown as first and second printed circuit boards $112_1$, $112_2$ in FIG. 1A and FIG. 1B, the at least one printed circuit board 112 can be provided as a single printed circuit board or more than two. It is contemplated that where the circuit interrupter 10 is a multi-pole device, i.e., a two or three pole device, each pole can have a dedicated ground fault circuit 100c on a respective dedicated and different at least one printed circuit board 112, or the device 10 can have one or more branches with shared ground fault circuit components provided on the same one or more printed circuit boards 112 as will be discussed further below with respect to FIGS. 8B, 9A and 9B.

FIG. 1B illustrates the first and second housings 11, 101 attached together with the terminals 12, 102 coupled (typically by directly contacting). As shown in FIG. 1A and FIG. 1B, the first and second terminals 12, 102 can each comprise a projecting rigid or semi-rigid free end portion 12e, 102e that face each other and that, when aligned, physically abut or contact to couple the second terminal 102 to the first terminal 12. The term "semi-rigid" means that the component has sufficient rigidity to have a self-supporting shape.

In some embodiments, the circuit breaker terminal 12 can comprise a terminal spring 13 with a pair of free ends 12e forming cooperating fingers 12f that slidably receive the ground fault module electrical terminal 102. The fingers 12f can extend a distance outside a perimeter of the first housing 11. The ground fault module terminal 102 can be configured as a stab and may have a flat or wavy body configuration that can project toward and into the circuit breaker terminal 12. However, the terminals 12, 102 can have the reverse configurations. That is, the terminal 102 of the ground fault module 100 can have a terminal spring with fingers and the circuit terminal 12 can have a stab configuration for a "plug-in". Other terminal configurations may be used. It is contemplated that providing a "plug-in" terminal-to-terminal connection 12, 102 without requiring lengths of loose wires (other than the customer input load-side lines to the collar assembly 125) can provide an easier assembly than conventional ground fault circuits in circuit breakers which require lengths of loose wire that can become tangled or be difficult to connect and/or assemble.

The ground fault module 100 can include at least one solenoid assembly 110, at least one current transformer (CT) 120 and at least one collar assembly 125 for engaging wiring for a load side connection. The solenoid assembly 110 can include a magnetized or magnetic member 111 such as a plunger 111p that can magnetically attract an aligned lever 15 in the first housing 11.

The ground module terminal 102 can be coupled to the at least one printed circuit board 112, typically directly connected to one as shown in FIG. 1A and FIG. 1B. The terminal 102 can be orthogonal to the attached printed circuit board 112 and extend a distance forward thereof as is also shown in FIG. 1A and FIG. 1B.

Referring to FIG. 1A and FIG. 1B, the ground fault module terminal 102 can reside within a boundary of a perimeter of the second housing 101, shown as residing closer to an outer facing side (load side), placing the associated printed circuit board 112 closer to the collar assembly 125 than the free end 102e of the terminal 102 and/or closer to the collar assembly 125 than the solenoid assembly 110

The circuit breaker 10 housing 11 holds the lever 15. The lever 15 comprises ferromagnetic material such as steel, and a movable contact arm 30 with an electrical contact 30c. The movable contact arm 30 engages a handle 20 and a mechanism spring (not shown, but well known to those of skill in the art). The circuit breaker 10 can also include at least one trip cam 68, a cradle 45, a bimetal member 67, a magnet 70, armature 75, shunt 77, and shunt bracket 79, for example. The circuit breaker 10 can also include an arc chute 35 and line terminal assembly 60 with a stationary electrical contact 60c (the latter components are shown schematically in broken line in FIG. 1A).

The lever 15 can be pivotably coupled to the housing 11 to be able to pivot about a pivot joint 15p and. The lever 15 is sized and configured to be able to be magnetically pulled toward a magnetized or magnetic member 111 in the ground fault module 100. The lever 15 can have an arm 15a that extends toward the movable arm 30 and can reside in front of the armature 75. The magnetized or magnetic member 111 pulls the lever 15 via magnetic attraction in a direction away from the line side contact terminal assembly 60 which unlatches the circuit breaker 10 in a trip event. The member 111 can comprise or be configured as a plunger that is held by the solenoid assembly 110 and is linearly movable in a direction toward and away from the lever 15.

Figure 6A:
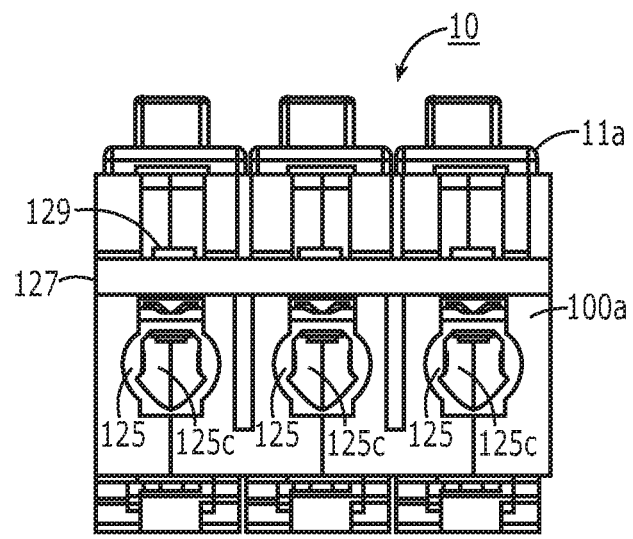
FIG. 6A is an end view (wiring input side) of the assembled devices shown in FIG. 5.
Figure 6B:
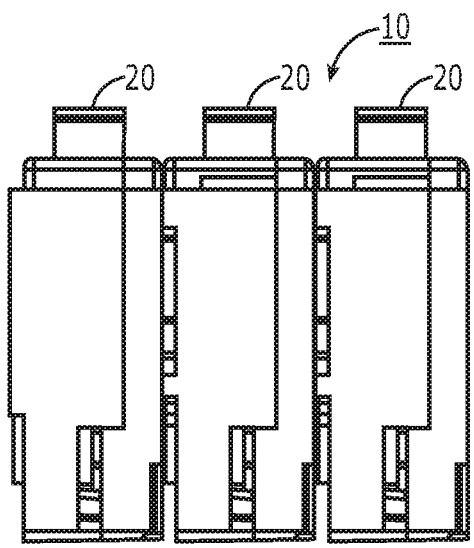
FIG. 6B is an opposing end view of the assembled devices shown in FIG. 6A.
Figure 7A:
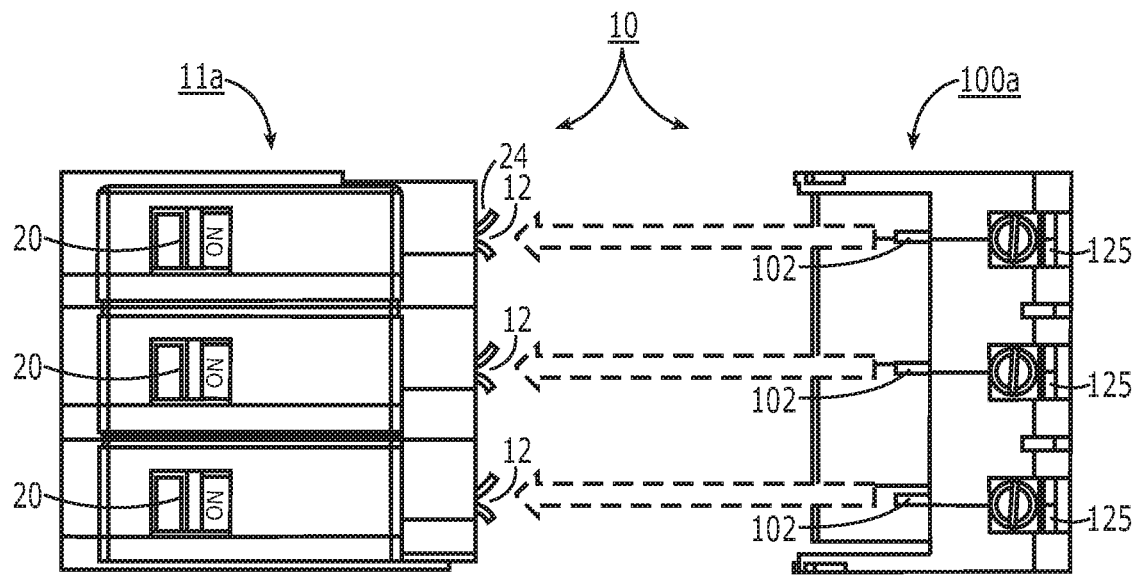
FIG. 7A is a front view of a three pole circuit breaker aligned with a ground fault module for assembly together according to embodiments of the present invention.
Figure 7B:
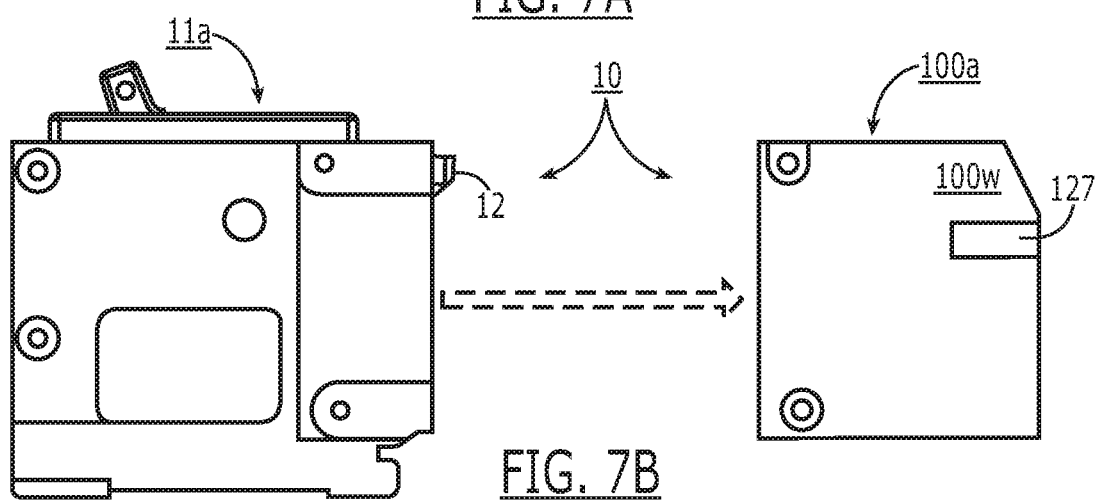
FIG. 7B is a side view of the circuit breaker and ground fault module shown in FIG. 7A.
Figure 7C:
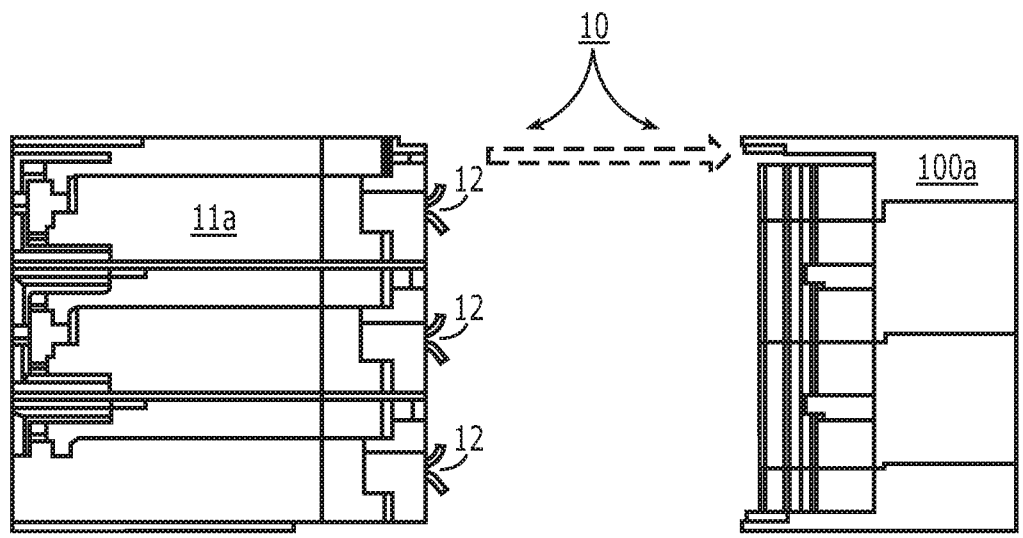
FIG. 7C is a back view of the circuit breaker and cooperating ground fault module shown in FIG. 7A.

The collar assembly 125 can include a threaded member 129 and can be arranged to face an outer perimeter side of the housing 101 with an open channel 126 of the housing 101 providing access to an open channel 125c of the collar assembly 125 (FIGS. 1B, 3B, 6A) for receiving customer wiring/cables.

Figure 2:
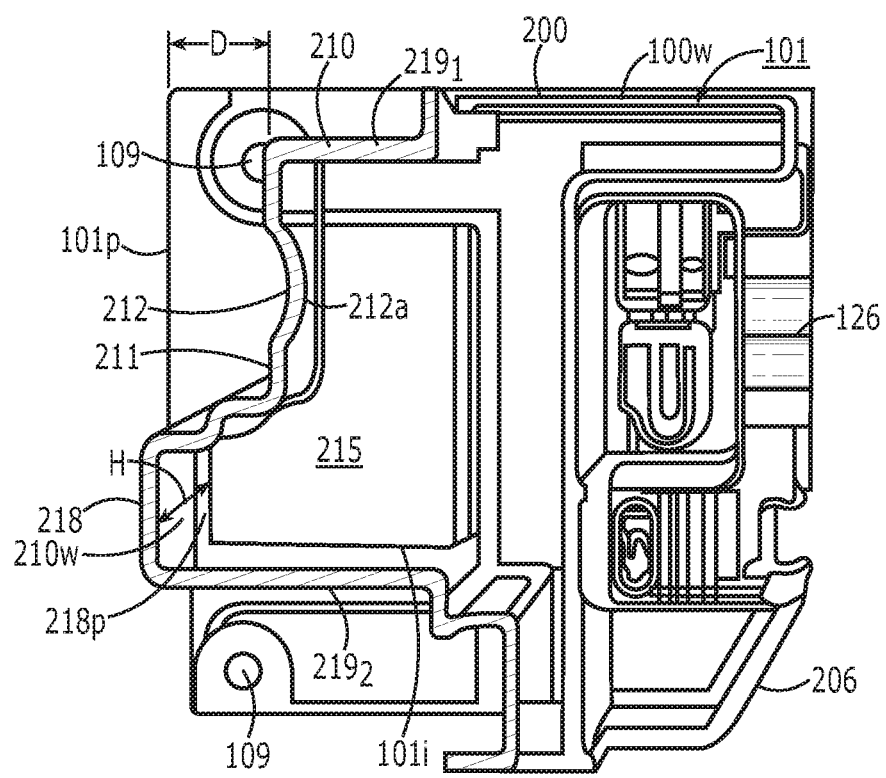
FIG. 2 is a top perspective view of an exemplary outer wall of a ground fault module according to embodiments of the present invention.

FIG. 2 illustrates an exemplary outer wall or cover 100w, which can be for each of cooperating first and second outer wall members 200, 206 (FIG. 9A, FIG. 9B) of the second housing 101. The outer wall 100w has an internal surface 101i with an internally facing solid barrier wall 210 which may protect circuit components during a trip or arcing event or allow larger current ratings of the circuit interrupter 10 (i.e., breaker). The barrier wall 210 can inhibit or prevent arc debris from damaging electronic components on the at least one printed circuit board 112. As shown, the internal barrier wall 210 has a front wall 211 with first segment 212 that can have an arcuate recess 212a that merges into a planar segment 218 that can reside a distance forward of the first segment 212. The arcuate recess segment 212a can be sized and configured to allow the magnetized/magnetic member (i.e., plunger) 111 to be able to translate toward and away from the first housing 10 (FIG. 1A, 1B). The barrier wall 210 can also include first and second parallel wall segments $219_1$, $219_2$ that are orthogonal to the front wall 211 and are spaced apart across an internal cavity space 215. The barrier wall 210 can have a constant or varying height H, typically a constant height, except for the recess 212a of the first segment 212 of the front wall 211. The height H can be in a range of about 0.10 inches and 1 inch, in some embodiments.

The barrier wall 210 can comprise a thermoset material such as glass polyester. In other embodiments, the barrier wall 210 and/or entire second housing 101 can comprise a thermoplastic material for lower cost options as there is no direct contact with the hot, thermal magnetic portion and/or no direct exposure to high interrupting currents or internal pressures from a 65 or 100 ka shot, for example. In this embodiment, the first housing 11 can comprise a thermoset material such as glass polyester.

In some embodiments, the first segment 212 of the front wall 211 of the barrier wall 210 can reside a distance D of between about 0.25-6 inches from the front perimeter 101p of the housing 101. The second segment 218 can be co-extensive with an adjacent front perimeter segment or reside a shorter distance therefrom relative to the first segment 212.

Figure 9A:
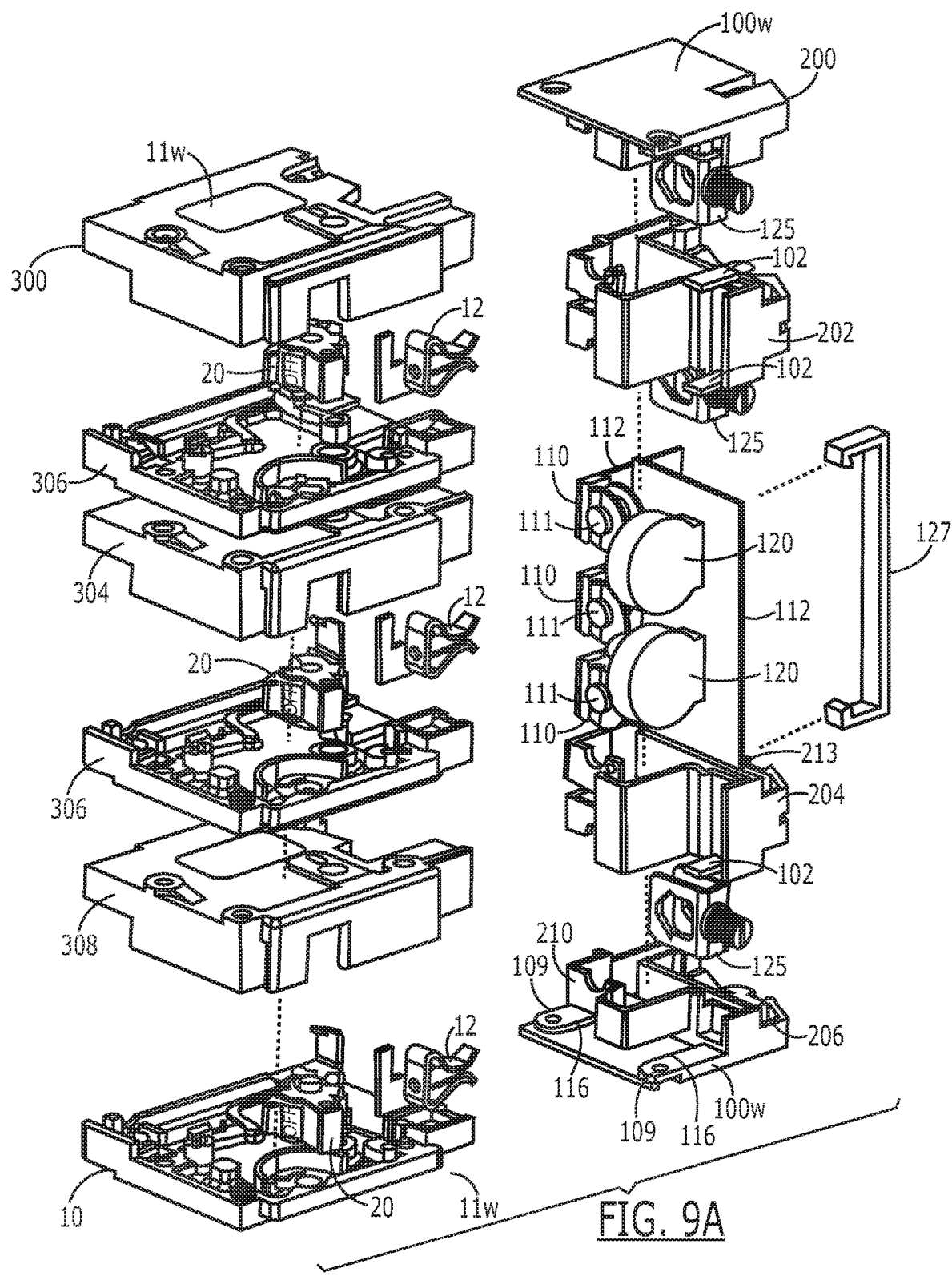
FIG. 9A is a partial exploded perspective view of a circuit interrupter with a ground fault module according to embodiments of the present invention.

The second segment 218 can be sized and configured to hold a cylindrical body 110b and/or CT 120 (FIG. 1A, 9A). The internal barrier wall 210 can have curvilinear perimeter with a solid front wall 211 with a first wall segment 212 comprising an arcuate recess 212a that allows the plunger 111p to extend and retract therethrough and a second wall segment 218 forming a rectangular pocket 218p that is sized and configured to hold at least one current transformer 120 to thereby provide a barrier from arc debris.

Referring to FIG. 1A, the solenoid assembly/solenoid body 110b can be statically affixed to a printed circuit board $112_2$ and can reside a distance "D" from a perimeter of the housing 101. This distance D can be between about 0.1-6 inches. The plunger 111p can extend and retract a distance from the solenoid body 110b, typically from about 0-1 inch, in operation.

Figure 3A:
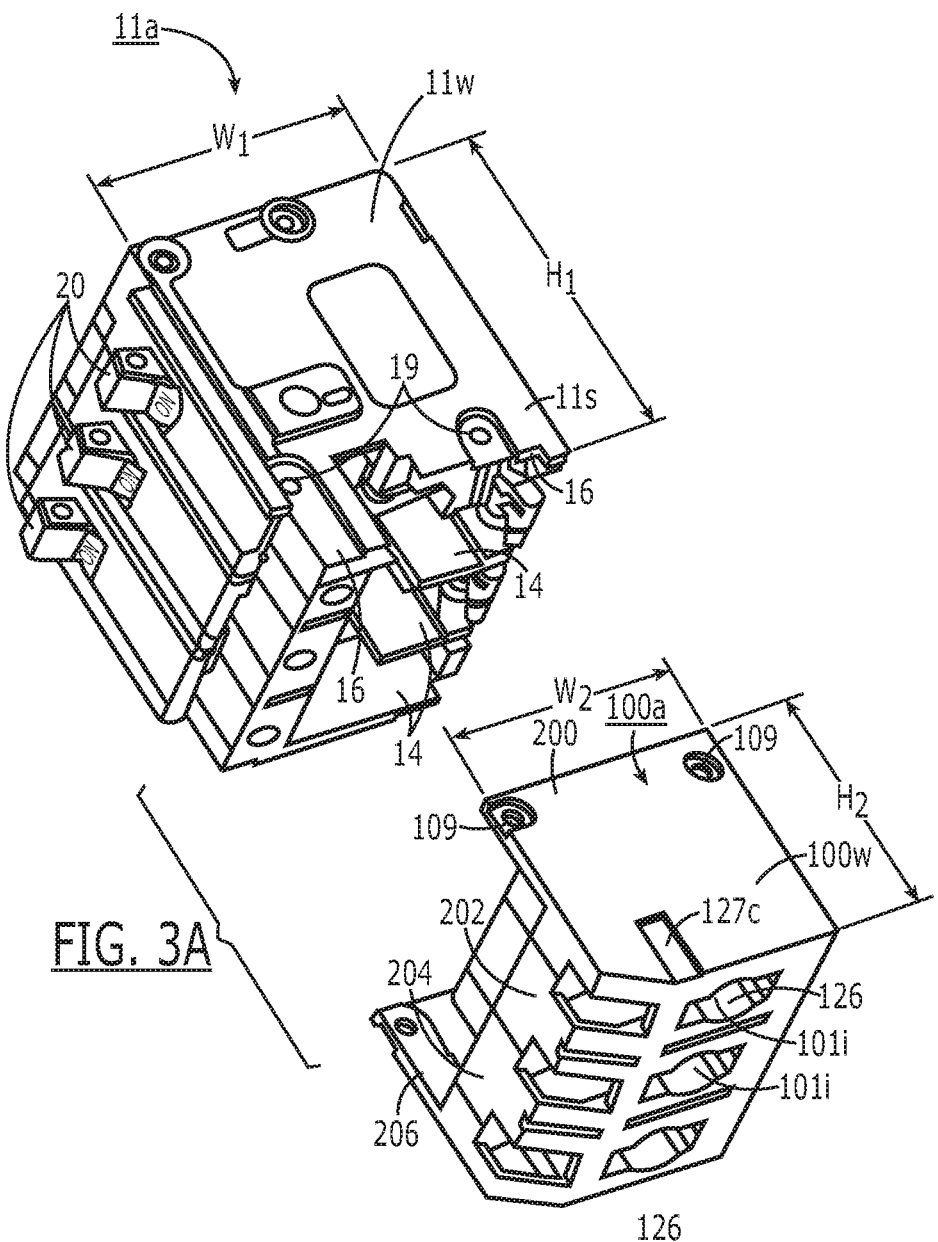
FIG. 3A is a side perspective view of a three pole circuit breaker and associated ground fault module assembly according to embodiments of the present invention.
Figure 3C:
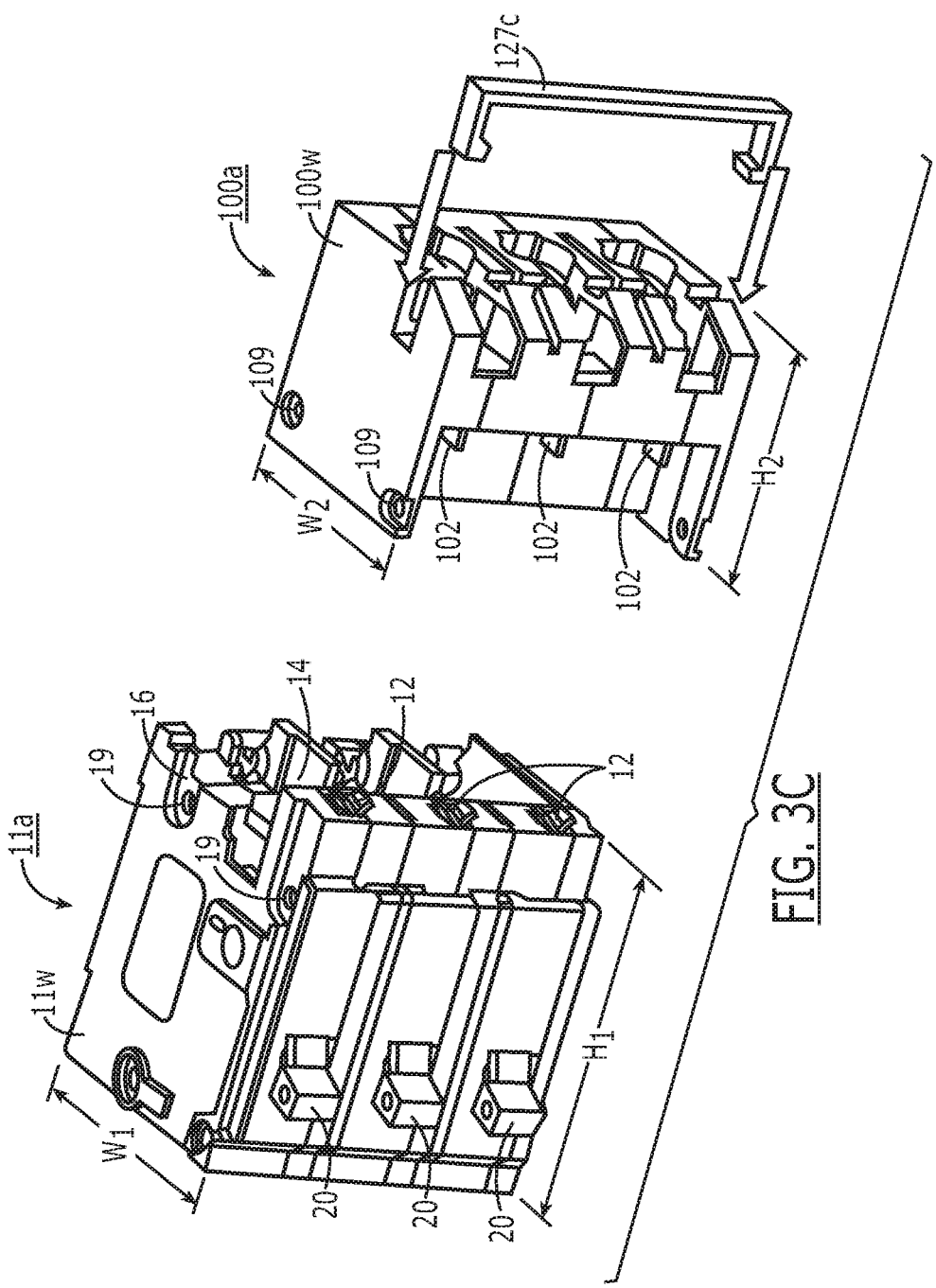
FIG. 3C is another side perspective view of the components shown in FIG. 3A.
Figure 4:
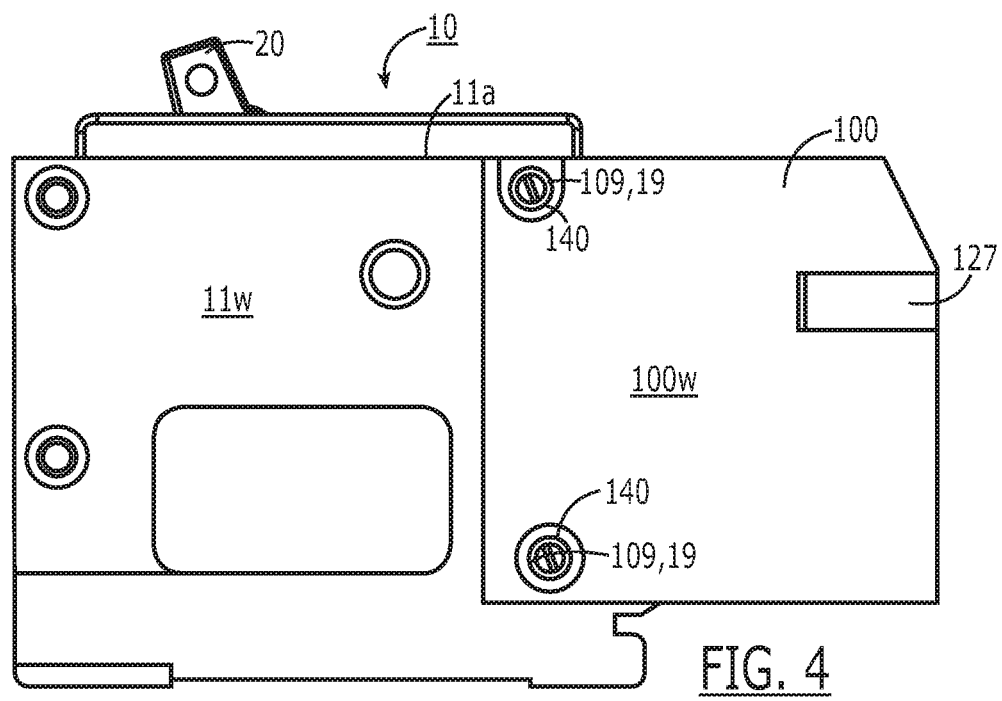
FIG. 4 is an enlarged side view of an assembled circuit breaker and ground fault module assembly according to embodiments of the present invention.
Figure 5:
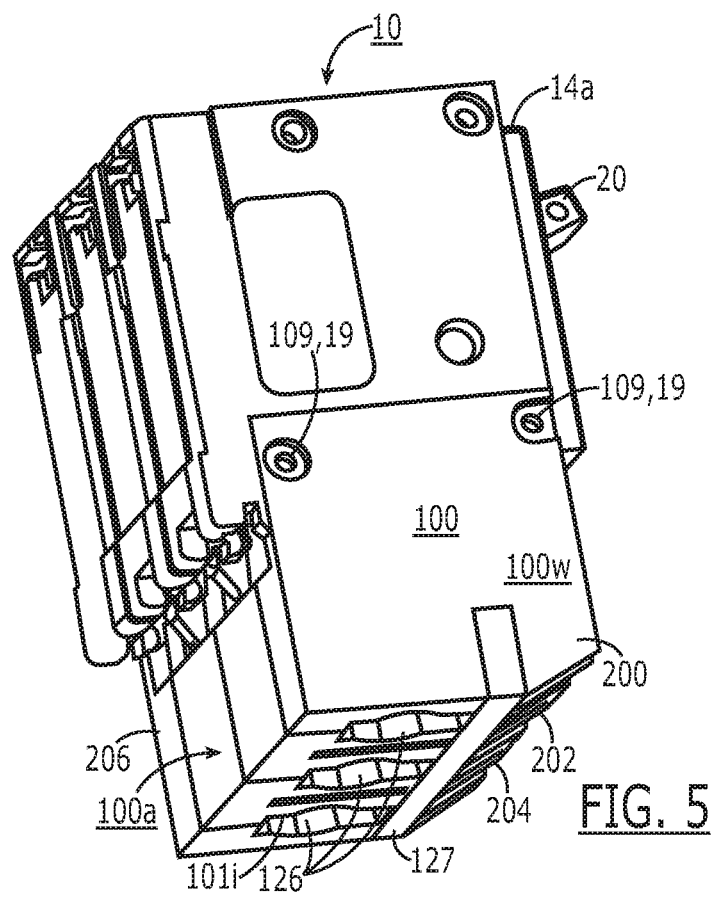
FIG. 5 is a bottom perspective view of the assembled circuit breaker and ground fault module assembly shown in FIG. 4.

Referring to FIGS. 3A-3C, the first housing 11 can be provided as a first housing assembly 11a and the second housing 101 can be provided as a second housing assembly 100a and the assemblies 11a, 100a are sub-assemblies of the circuit interrupter device 10 and can be attached together to form the circuit interrupter 10 with multiple poles, shown as three poles, but the device 10 can have other numbers of poles, such as a two pole configuration or even a single pole configuration.

An attachment member 127 may optionally be used to attach the housing members 200, 202, 204, 206 (FIG. 3A) of the ground module 100 together. As shown, a clamp 127c (FIGS. 3A, 3B) can be used as an attachment member 127 to attach multiple cooperating housing members 200, 202, 204, 206 of a housing assembly 100a providing a collar assembly 125 and ground circuit 100c. However, other attachment configurations and devices are contemplated by embodiments of the present invention.

As shown in FIGS. 3A, 3B, 3C, 4, 5 and 6A-6C, the first housing assembly 11a can have outer walls 11w with apertures 19 and the second housing assembly 100a can have apertures 109 that align with the apertures 19 and receive fixation members to affix the first and second housings 11, 101 together. The outer wall 100w of the second housing assembly 100a can form the outer wall of the device 10. A sub-portion 11s of the outer wall 11w of the first housing 11 can reside under a segment of the adjacent outer wall 100w of the second housing assembly 100a. The sub-portion 11s can have a recess 16 (FIGS. 3A, 3B) that can be shaped to receive a corresponding projection 116 (FIGS. 3B, 9A, 9B) on the inner surface of the outer wall 100w for ease of sliding assembly alignment so that the first housing terminal(s) 12 align with the second housing terminal(s) 102 as the housings 11, 101 couple together at adjacent sides thereof. The opposite configuration may also be used, i.e., with the inner surface of the outer wall 100w having a recess and the sub-segment 11s of the first housing 11 having a mating projection.

Bolts, rivets, screws or other attachment members 140 (FIG. 4) can extend through the respective aligned aperture 19, 109 to couple the ground fault module assembly 100a to the circuit breaker sub-assembly 11a and form the assembled housing of the circuit interrupter 10.

The first housing 11 and/or the second housing 101 may be a molded case body. As shown in FIG. 1A, the first housing 11 can have a sidewall that has an internal cavity 13 that receives and holds one side of the arc chute 35 therein.

As shown in FIGS. 3A-3C, for example, the first housing assembly 11a can provide the terminals 12 on one wall segment adjacent medial open spaces 14. The terminals 12 can have external free end portions that slidably directly engage the second terminals 102 without requiring loose lengths of wires to electrically couple the terminals 12, 102. The medial open spaces 14 allow the lever 15 of each pole to cooperate with a corresponding solenoid assembly 110 of the second housing assembly 100a.

Still referring to FIGS. 3A-3C, the first housing 11 can have a height $H_1$ and a width $W_1$ that is larger than a height $H_2$ and a width $W_2$ of the second housing 101.

The second housing assembly 100a can be provided as a stacked set of cooperating housing members 200, 202, 204, 206, with a pair of adjacent internal facing walls 101i holding a respective collar assembly 125 and forming the open channel 126 in the housing 101. Thus, adjacent pairs of the housing members, i.e., (1) 200 and 202; (2) 202 and 203; and (3) 204 and 206 can have internal wall surfaces 101i comprising shaped internally facing recesses that cooperate on opposing sides of a respective open channel 126. The inner housing members 202, 204 can have dual internal walls 101w, one facing up and one facing down (in the orientation shown in FIG. 3B, with the external handle 20 facing forward and/or to the right), one forming a part of the open channel 126 of a first pole and one forming part of the open channel 126 for a second pole, for example. The outer housing members 200, 206 which form the outer walls 100w, can provide an inner surface of a single pole wall segment of a respective open channel 126.

Figure 8A:
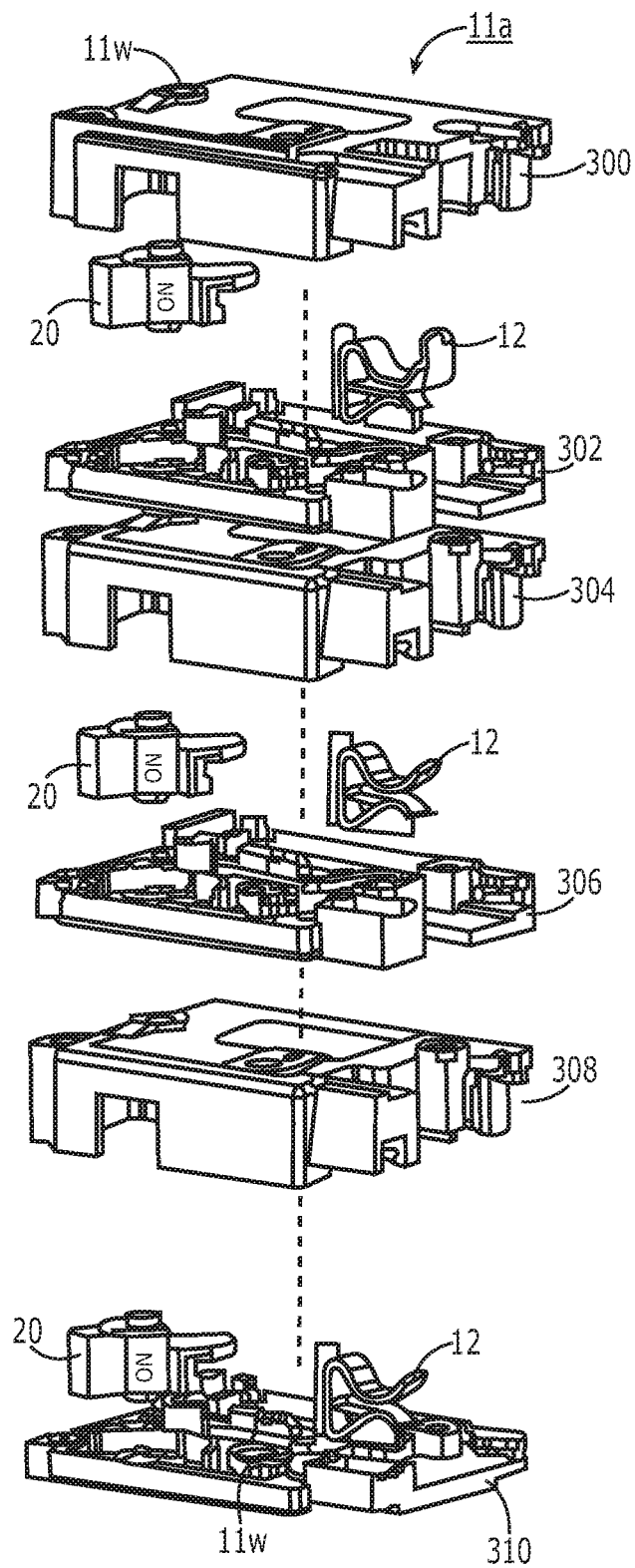
FIG. 8A is a partial exploded view of a housing assembly of a circuit interrupter according to embodiments of the present invention.
Figure 9B:
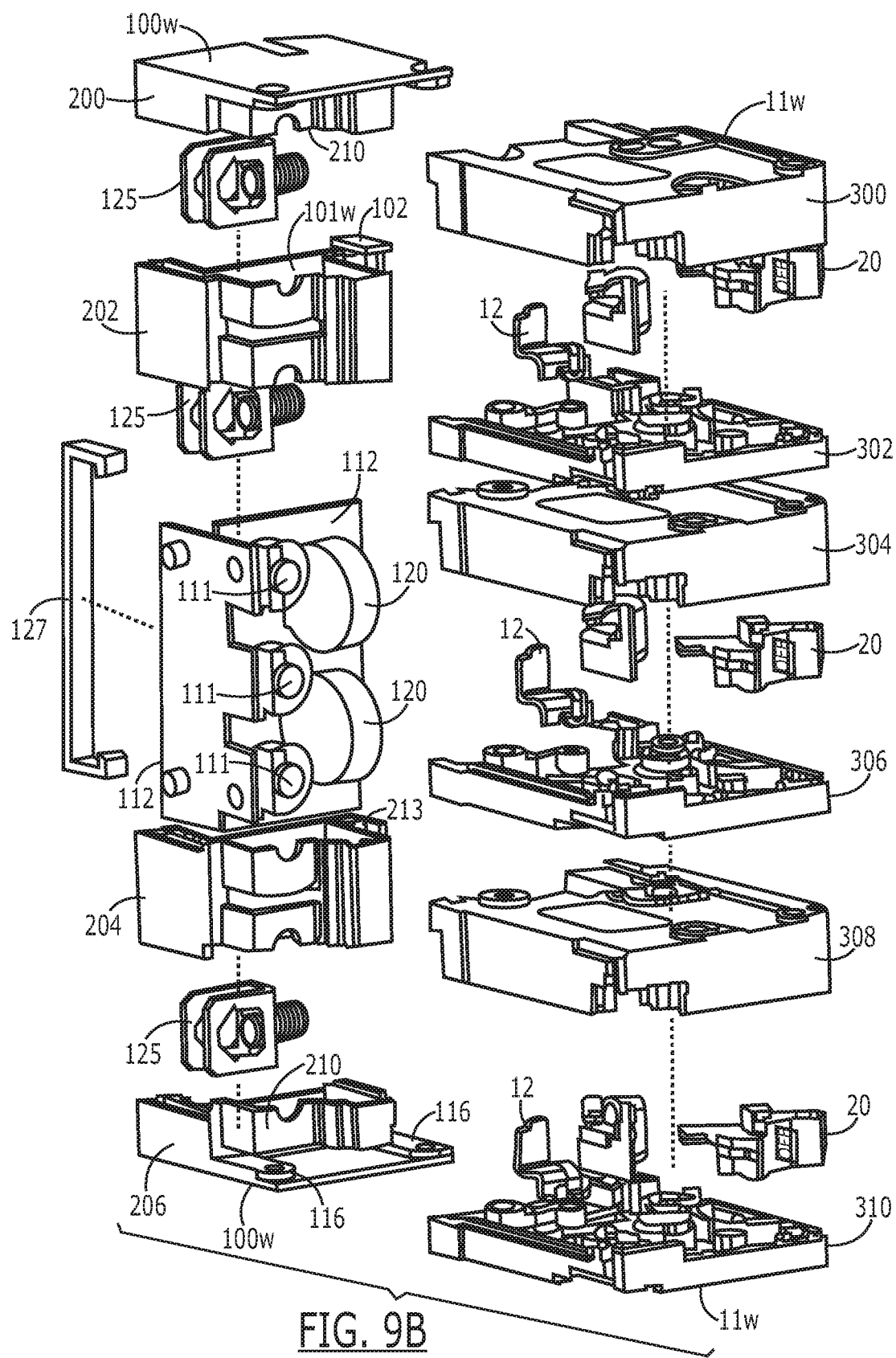
FIG. 9B is another partial exploded perspective view of a circuit interrupter with a ground fault module according to embodiments of the present invention.

FIGS. 8A, 9A and 9B illustrate that the first housing assembly 11a can also comprise a stacked set of cooperating housing members 300, 302, 304, 306, 308 and 310. The outer housing members 300, 310 comprising the outer walls 11w. In the embodiment shown, there are three poles with three collar assemblies 125, three pairs of terminals 12, 102 and three solenoid assemblies 110.

Figure 8B:
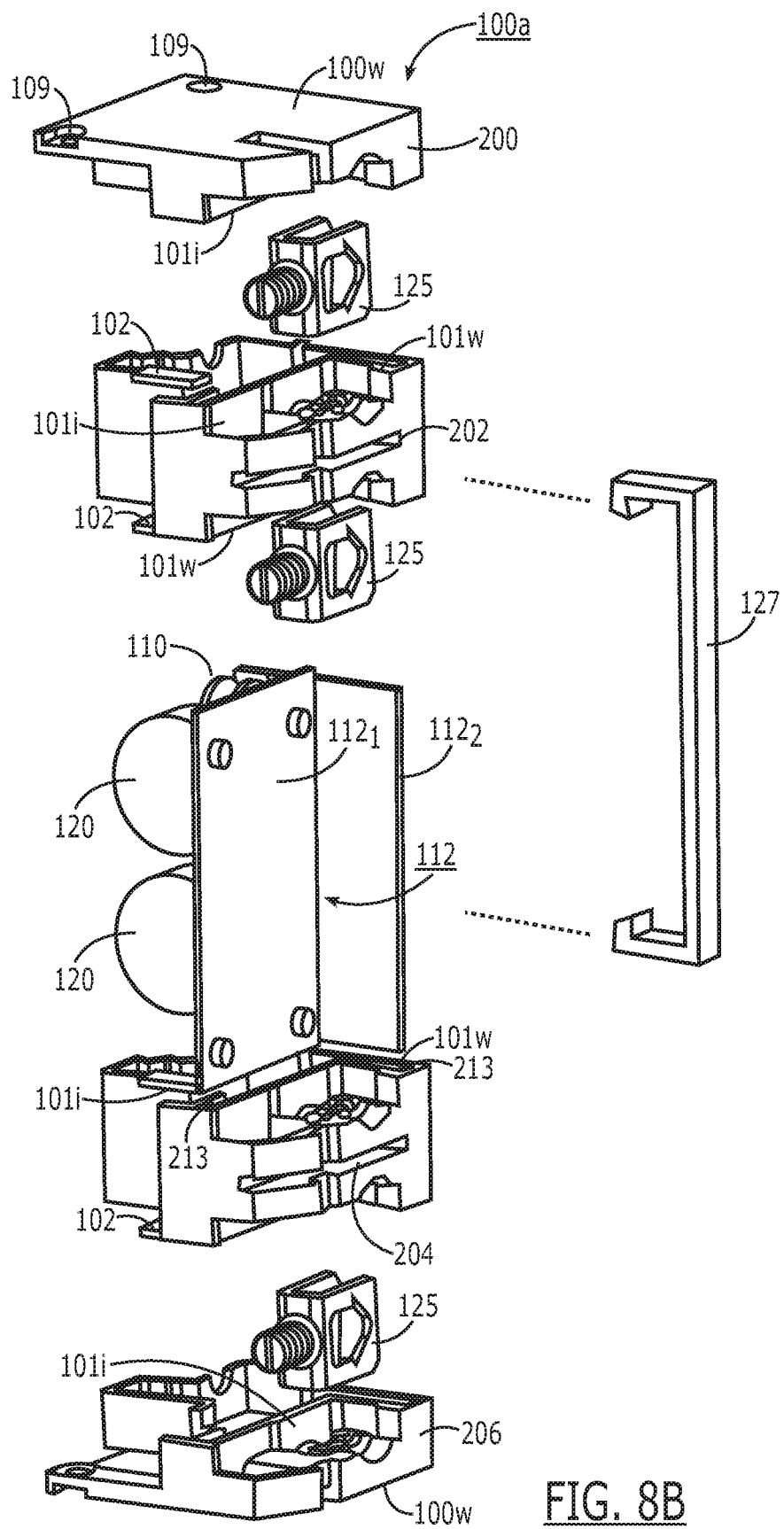
FIG. 8B is a partial exploded view of a ground fault module housing assembly according to embodiments of the present invention.

FIGS. 8B, 9A and 9B illustrate that one printed circuit board 112 can comprise a plurality of current transformers 120, which may be laterally aligned as shown or offset. The plurality of current transformers 120 are shown as first and second adjacent current transformers held on a single one of the at least one printed circuit board 112. The at least one solenoid assembly 110 can be a plurality of adjacent solenoid assemblies, shown as held on a common one of the at least one printed circuit board. The first and second current transformers 120 can be held on a first one of the at least one printed circuit board $112_1$ and the plurality of adjacent solenoid assemblies 110 can be held on a second one of the printed circuit boards $112_2$, with respective magnetic or magnetized members 111 facing away from the collar assemblies 125.

Some or all of the housing members 200, 202, 204, 206 can include slots or shaped openings 213 (FIGS. 9A, 9B) that hold the one or more printed circuit boards 112 in a desired orientation. As shown in FIGS. 8B, 9A and 9B no loose lengths of wiring are required to form part of the ground fault circuit 100c and/or to connect to the circuit breaker, i.e., no loose lengths of wires past the collar assembly 125.

Figures 11, 11A:
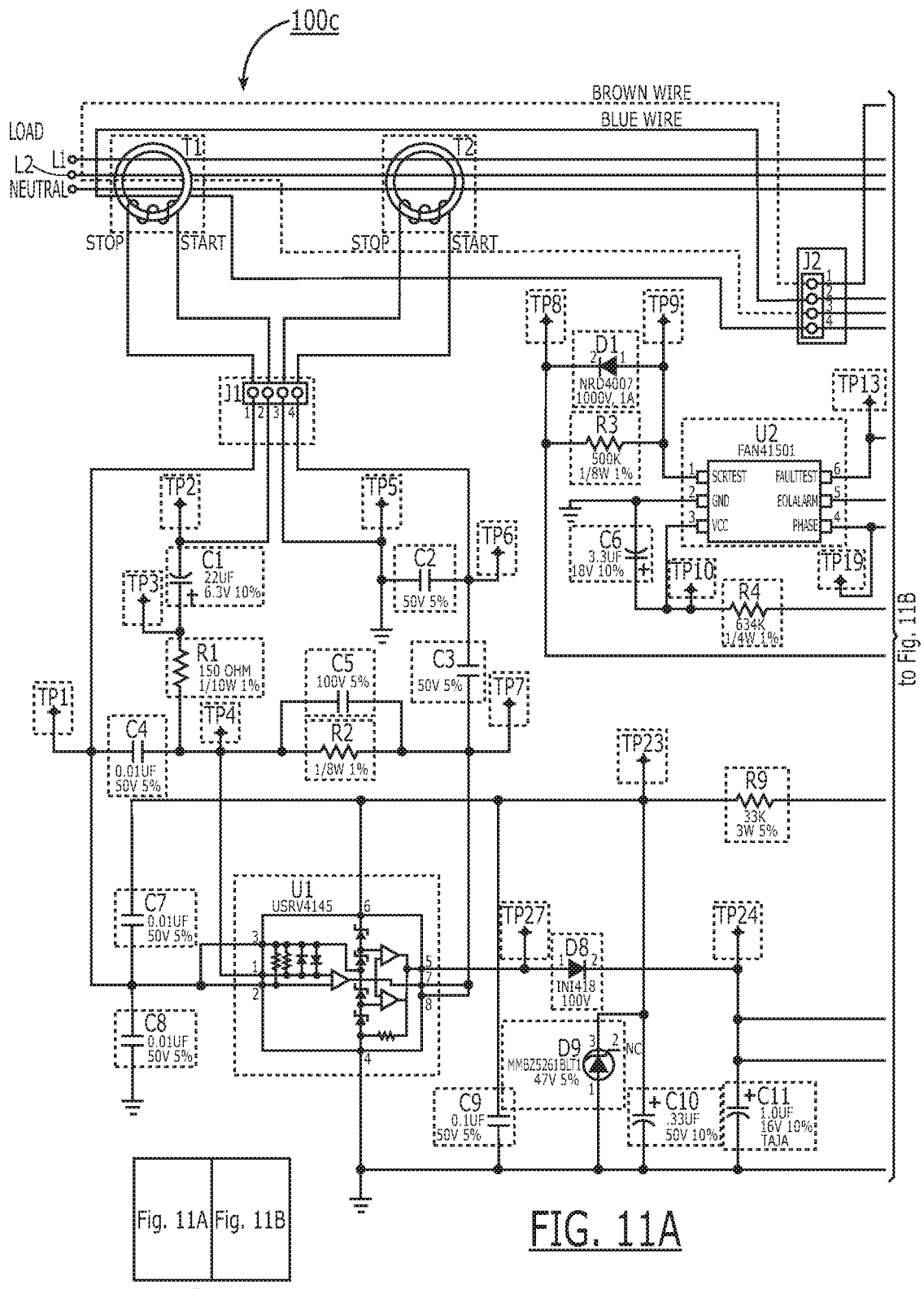
FIG. 11 is an example ground fault circuit for a ground fault module for a circuit interrupter having a two pole configuration according to embodiments of the present invention.
FIGS. 11A and 11B are split segments of FIG. 11 shown on two sheets.
Figure 11B:
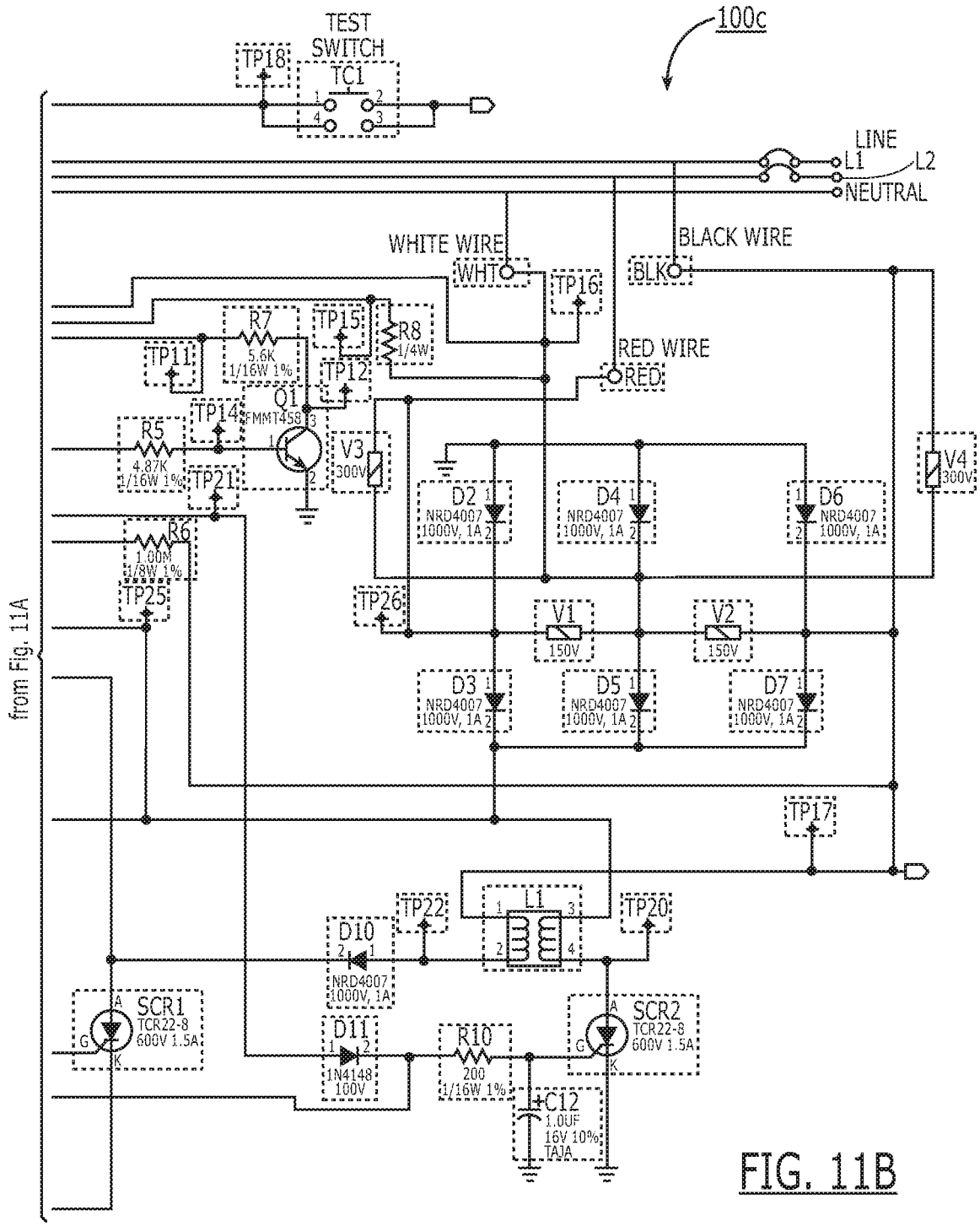

FIG. 11 is a schematic circuit diagram of an exemplary two-pole ground fault circuit 100c for the ground fault module 100 according to embodiments of the present invention. Other ground fault circuit configurations may be employed as will be known to those of skill in the art.

In some embodiments, the circuit breakers 10 can be DC circuit breakers, AC circuit breakers, or both AC (alternating current) and DC (direct current) circuit breakers.

Unlike conventional current limitations of about 50 Amps ("A") for a two-pole thermal magnetic circuit breaker with an onboard ground fault circuit, embodiments of the present invention provide circuit interrupters with the ground fault module 100 that can allow for greater current ratings, for example, 75 A, 100 A, 125 A, 150 A, 175 A, 200 A or even greater current amperage ratings.

In some embodiments, the circuit interrupter 10 with the ground fault module 100 can be a 100 A, 22 kA two and/or three pole product or a 100 A and one of a 42 kA, 65 kA or 100 kA product.

In some embodiments, the circuit interrupter 10 with the ground fault module 100 can be a two pole 150 A product with a 22 kA product (although a greater interrupting level rating such as a 42 kA, 65 kA or 100 kA rating may be possible).

In some embodiments, the circuit interrupter 10 can be a 125 amp, two pole device that can interrupt at a 100 kA HIC interrupting level.

The circuit breakers 10 may be high-rated miniature molded case circuit breakers, e.g., 240V and above 50 A in a compact package.

In some embodiments, the circuit interrupter 10 can be provided as a three pole configuration of: 10-100 A, 10-42 ka, 240 v.

In some embodiments, the circuit interrupter 10 can be provided as a two pole configuration of: 120/240 v, 240 v, 10-125 A, 10-100 ka or 277/480 v, 2 pole 15-30 A.

However, it is contemplated that the circuit breaker/interrupter 10 with the ground fault module 100 can be used for any voltage, current ranges and are not limited to any particular application or use.

As discussed above, the circuit interrupters 10 can be molded case circuit breakers (MCCB)s. MCCBs are well known. See, e.g., U.S. Pat. Nos. 4,503,408, 4,736,174, 4,786,885, and 5,117,211, the contents of which are hereby incorporated by reference as if recited in full herein. The circuit breakers 10 can be a bi-directional DC MCCB. See, e.g., U.S. Pat. No. 8,222,983, the content of which is hereby incorporated by reference as if recited in full herein. The DC MCCBs can be suitable for many uses such as data center, photovoltaic, and electric vehicle applications.

Figure 10:
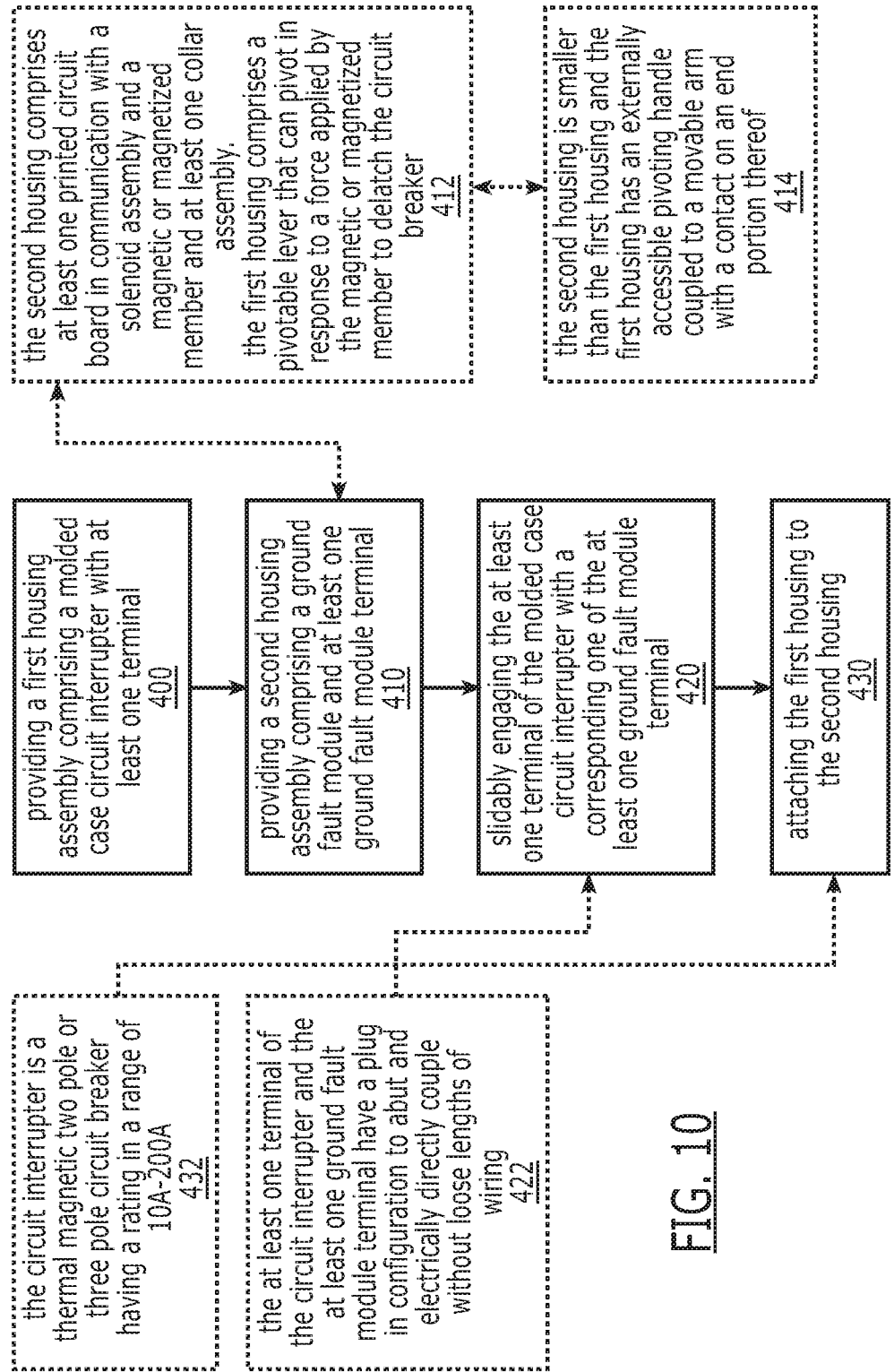
FIG. 10 is a flow chart of an exemplary method of assembling a ground fault module to a circuit breaker according to embodiments of the present invention.

FIG. 10 illustrates features associated with a method of assembling a circuit interrupter. As shown, a first housing assembly comprising a molded case circuit interrupter with at least one terminal is provided (block 400). A second housing assembly comprising a ground fault module and at least one ground fault module terminal is also provided (block 410). One of the at least one terminal of the circuit interrupter is slidably engaged with a corresponding one of the at least one ground fault module terminal (block 420). The first housing is attached to the second housing (block 430).

The second housing can comprise at least one printed circuit board in communication with a solenoid assembly and a magnetic or magnetized member and at least one collar assembly and the first housing comprises a pivotable lever that can pivot in response to a force applied by the magnetic or magnetized member to delatch the circuit breaker (block 412).

The second housing is smaller than the first housing and the first housing has an externally accessible pivoting handle coupled to a movable arm with a contact on an end portion thereof (block 414).

The at least one terminal of the circuit interrupter and the at least one ground fault module terminal have a plug in configuration to abut and electrically directly couple without loose lengths of wiring (block 422).

The circuit interrupter can be a thermal magnetic two pole or three pole circuit breaker having a rating in a range of 10 A-200 A (block 432).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed:

1. A circuit interrupter, comprising:
   a first housing having opposing first and second ends;
   a first terminal in the first housing;
   a second housing extending outside of the second end of the first housing while coupled to the first housing;
   a ground fault circuit in the second housing; and
   a second terminal electrically coupled to the ground fault circuit and electrically coupled to the first terminal.

2. The circuit interrupter of claim 1, wherein the second terminal comprises a projecting rigid or semi-rigid free end portion that faces the first terminal, wherein the first terminal comprises an aligned projecting rigid or semi-rigid free end portion, and wherein the first terminal free end portion and the second terminal free end portion abut to electrically couple the second terminal to the first terminal.

3. The circuit interrupter of claim 1, further comprising:
   a handle held by the first housing;
   a movable arm in communication with the handle and holding an electrical contact at an end portion thereof;
   a line terminal assembly with a stationary contact adjacent the end portion of the movable arm with the electrical contact;
   a pivotable lever spaced apart from the movable arm, facing the second housing;
   a solenoid assembly comprising a respective magnetic or magnetized member in the second housing that is sized and configured to be able to magnetically attract the pivotable lever toward the solenoid assembly;
   at least one printed circuit board in the second housing comprising components of the ground fault circuit; and
   at least one collar assembly provided by the second housing, a respective collar assembly for each pole positioned adjacent an open channel that is sized and configured to route a cable to couple a load input to the ground fault circuit.

4. The circuit interrupter of claim 1, wherein the first terminal has an outer end portion that extends outside a boundary of the first housing into the second housing.

5. The circuit interrupter of claim 1, wherein the circuit interrupter is a two pole or three pole device, wherein the first housing is a first housing assembly comprising a plurality of stacked adjacent first housing members with a respective first terminal for each pole comprising a free outer end portion extending external from the first housing, wherein the second housing is a second housing assembly comprising a plurality of stacked adjacent housing members, wherein the first housing assembly comprises first and second outer walls, and wherein the second housing assembly comprises first and second outer walls that attach to the first and second outer walls of the first housing assembly.

6. The circuit interrupter of claim 1, wherein the circuit interrupter is a two pole or three pole device and has a rating in a range of 10 A-200 A.

7. The circuit interrupter of claim 1, wherein the ground fault circuit in the second housing comprises at least one printed circuit board, wherein the second housing is a second housing assembly with cooperating first and second outer walls, wherein the first and second outer walls are external to the first housing, and wherein at least one of the first and second outer walls comprises an internal barrier wall that faces the first housing and projects a distance above the at least one printed circuit board in the second housing to thereby provide a barrier from arc debris.

8. A circuit interrupter, comprising:
   a first housing;
   a first terminal in the first housing;
   a second housing coupled to the first housing;
   a ground fault circuit in the second housing; and
   a second terminal electrically coupled to the ground fault circuit and electrically coupled to the first terminal,
   wherein the second housing is a second housing assembly comprising a plurality of stacked adjacent housing members, at least one housing member for each pole and with the at least one housing member for each pole comprising an internal wall segment with an arcuate recess, the circuit interrupter further comprising:
   at least one printed circuit board in the second housing and comprising components of the ground fault circuit; and
   at least one collar assembly for each pole positioned adjacent an open channel bounded in part by the arcuate recess that is sized and configured to route a cable to couple a load input to the ground fault circuit.

9. The circuit interrupter of claim 1, wherein the first housing has a height and a width that is larger than a height and a width of the second housing, wherein the second terminal comprises a projecting rigid or semi-rigid free end portion that faces the first terminal, wherein the first terminal comprises an aligned projecting rigid or semi-rigid free end portion, and wherein one of the first terminal free end portion or the second terminal free end portion comprises a terminal spring defining spring fingers that slidably couples to another of the first terminal free end portion or the second terminal free end portion to electrically couple the first and second terminals.

10. The circuit interrupter of claim 3, wherein the solenoid assembly is provided as a plurality of solenoid assemblies in the second housing, and wherein the at least one printed circuit board includes one printed circuit board that holds the plurality of solenoid assemblies adjacent each other.

11. A ground fault module, comprising:
a housing;
at least one ground fault terminal, wherein the at least one ground fault terminal is a rigid or semi-rigid member that is configured to slidably engage a circuit breaker terminal;
a ground fault circuit coupled to the ground fault terminal;
at least one printed circuit board in the housing and comprising components of the ground fault circuit including at least one solenoid assembly coupled thereto with a plunger member residing on or adjacent thereto, and at least one current transformer; and
at least one collar assembly residing in the housing spaced apart from the at least one solenoid assembly and plunger member.

12. The ground fault module of claim 11, wherein the housing comprises apertures on first and second spaced apart corner portions thereof sized and configured for receiving fixation members to attach the housing to a housing comprising a circuit interrupter, wherein the housing comprises at least one outer wall that comprises an internal barrier wall that projects a distance above the at least one printed circuit board, and wherein the internal barrier wall comprises a solid front wall with a first wall segment comprising an arcuate recess that allows the plunger to extend and retract and a second wall segment forming a rectangular pocket that is sized and configured to hold the at least one current transformer to thereby provide a barrier from arc debris.

13. The ground fault module of claim 11, wherein the ground fault module is a two pole or three pole ground fault module, and wherein there is one collar assembly of the at least one collar assembly for each pole and one solenoid assembly of the at least one solenoid assembly for each pole.

14. The ground fault module of claim 11, wherein the at least one printed circuit board includes one printed circuit board that holds a plurality of solenoid assemblies adjacent each other.

15. The ground fault module of claim 11, wherein the ground fault terminal is a stab that resides inside the housing and faces an open space sized and configured to slidably engage a terminal spring of a circuit interrupter.

16. The ground fault module of claim 11, wherein the housing is a housing assembly comprising a plurality of stacked adjacent housing members, at least one housing member for each pole and with the at least one housing member for each pole comprising an internal wall segment with an arcuate recess.

17. A method for assembling a current interrupter comprising:
providing a first housing assembly comprising a molded case circuit interrupter with at least one outwardly projecting rigid or semi-rigid terminal comprising an external free end portion;
providing a second housing assembly comprising a ground fault module and at least one ground fault module terminal, wherein the second housing assembly is external of the molded case circuit interrupter;
slidably coupling one of the at least one outwardly projecting rigid or semi-rigid terminal with a corresponding one of the at least one ground fault module terminal; and
attaching the first housing assembly to the second housing assembly.

18. A method for assembling a current interrupter comprising:
providing a first housing assembly comprising a molded case circuit interrupter with at least one outwardly projecting terminal comprising an external free end portion;
providing a second housing assembly comprising a ground fault module and at least one ground fault module terminal;
slidably coupling one of the at least one outwardly projecting terminal with a corresponding one of the at least one ground fault module terminal; and
attaching the first housing assembly to the second housing assembly,
wherein the second housing assembly comprises at least one printed circuit board in communication with a solenoid assembly and a magnetic or magnetized member and at least one collar assembly, and wherein the first housing assembly comprises a pivotable lever, wherein, in operation, the pivotable lever pivots in response to a magnetic force applied by the magnetic or magnetized member to delatch the circuit breaker.

19. The method of claim 17, wherein the second housing assembly is smaller than the first housing assembly and the first housing assembly has an externally accessible pivoting handle coupled to a movable arm with a contact on an end portion thereof, and wherein the method further comprises coupling an external cable to a collar assembly held by the second housing assembly to electrically provide a load input to the ground fault module.

20. The method of claim 17, wherein the at least one projecting rigid or semi-rigid terminal of the circuit interrupter and the at least one ground fault module terminal have a plug in configuration whereby the slidably coupling is carried out so that end portions of aligned terminals abut and electrically directly couple without loose lengths of wiring.

21. The method of claim 17, wherein the second housing assembly comprises an outer wall with a curvilinear internal barrier wall.

22. The method of claim 17, wherein the circuit interrupter is a thermal magnetic two pole or three pole circuit breaker having a rating in a range of 10 A-200 A.

* * * * *